United States Patent
Naito et al.

(10) Patent No.: US 8,719,550 B2
(45) Date of Patent: May 6, 2014

(54) RECONFIGURABLE PROCESSING SYSTEM INCLUDING SYNCHRONIZED POSTPROCESSING

(75) Inventors: Takao Naito, Kanagawa (JP); Kazuo Yamada, Kanagawa (JP)

(73) Assignee: Fuji Xerox Co., Ltd., Tokyo (JP)

(*) Notice: Subject to any disclaimer, the term of this patent is extended or adjusted under 35 U.S.C. 154(b) by 701 days.

(21) Appl. No.: 12/869,200

(22) Filed: Aug. 26, 2010

(65) Prior Publication Data

US 2011/0238954 A1    Sep. 29, 2011

(30) Foreign Application Priority Data

Mar. 25, 2010  (JP) .................................. 2010-069432

(51) Int. Cl.
*G06F 15/00*    (2006.01)
*G06F 15/76*    (2006.01)

(52) U.S. Cl.
USPC ........................................................... 712/15

(58) Field of Classification Search
None
See application file for complete search history.

(56) References Cited

U.S. PATENT DOCUMENTS

| | | | |
|---|---|---|---|
| 7,017,033 B2 | 3/2006 | Uchino | |
| 2005/0108290 A1 | 5/2005 | Mita et al. | |
| 2005/0283743 A1 | 12/2005 | Mulholland et al. | |
| 2006/0248317 A1* | 11/2006 | Vorbach et al. | ............... 712/221 |
| 2009/0013150 A1* | 1/2009 | Yamanaka | ..................... 712/22 |
| 2009/0083527 A1 | 3/2009 | Hanai et al. | |
| 2009/0237113 A1 | 9/2009 | Marui | |

FOREIGN PATENT DOCUMENTS

| | | |
|---|---|---|
| JP | A-2003-198362 | 7/2003 |
| JP | A-2004-70524 | 3/2004 |
| JP | A-2004-200311 | 7/2004 |
| JP | A-2005-353061 | 12/2005 |
| JP | A-2009-75875 | 4/2009 |
| WO | WO 2008/013098 A1 | 1/2008 |

OTHER PUBLICATIONS

Office Action dated Jan. 14, 2014 issued in Japanese Patent Application No. 2010-069432 (with English Translation).

* cited by examiner

*Primary Examiner* — Andrew Caldwell
*Assistant Examiner* — George Giroux
(74) *Attorney, Agent, or Firm* — Oliff PLC

(57) ABSTRACT

Source code to be processed is analyzed and configuration data in implementing in accordance with each of plural implementation systems is created and is stored in a local memory of a DRP incorporating system. When execution of target processing is started, the implementation system determination processing calculates estimated processing time when the configuration of each of the implementation systems is adopted and determines the optimum one of the implementation systems based on a combination of the estimated processing time and the circuit scale of the configuration.

3 Claims, 15 Drawing Sheets

RECONFIGURABLE PROCESSING SYSTEM INCLUDING SYNCHRONIZED POSTPROCESSING

CROSS-REFERENCE TO RELATED APPLICATIONS

This application is based on and claims priority under 35 USC 119 from Japanese Patent Application No. 2010-069432 filed on Mar. 25, 2010.

BACKGROUND

1. Technical Field

This invention relates to a data processing apparatus.

2. Related Art

Reconfigurable circuits (also called programmable logical circuits) of a PLD (Programmable Logic Device), an FPGA (Field Programmable Gate Array), etc., whose internal logical circuit configurations can be reconfigured (changed) become widespread. In general PLD and FPGA, when the circuit is started, the internal logical circuit configuration is set; PLD and FPGA whose logical circuit configurations can be changed during the operation of the circuits are also developed. Use of a DRP (Dynamic Reconfigurable Processor) whose internal logical circuit configurations can be dynamically reconfigured proceeds.

A tool for automatically converting a program to be implemented describing processing to be implemented in a language of C++, etc., into a circuit or a time-series pipeline of circuits configured on a reconfigurable circuit, namely, generating circuit information representing such a circuit or a pipeline is also devised.

Processing to be executed by the reconfigurable circuit contains processing wherein one processing (called postprocessing) synchronously inputs the results of a plurality of types of different processing (preprocessing) executed before the processing. There is a case where the plurality of types of preprocessing perform output having asynchronous relationship. The case where the different types of processing perform output having asynchronous relationship is, for example, a case where since a loop does not exist in different processing although a loop exists in one processing, if the same input data is given to both, a different delay occurs until the processing result is obtained from input between the former and the latter. When processing in which a loop exists and processing in which no loop exists advances processing in accordance with a clock, processing in which a loop exists delays as much as the loop and thus such a delay difference occurs. Thus, when a circuit for executing such processing is reconfigured on a reconfigurable circuit, a mechanism for synchronizing the processing results of the circuits of the preprocessing with each other and giving the results to the postprocessing.

SUMMARY

According to an aspect of the invention, a data processing apparatus includes an extraction section, an implementation section and a control section. The extraction section extracts a plurality of types of preprocessing in asynchronous relationship with each other and post processing for inputting the processing result of each preprocessing from implementation target processing. The implementation section has as implementation systems for implementing the implementation target processing using a reconfigurable circuit, a plurality of implementation systems including (1) a first implementation system for (i) reconfiguring prestage circuits each for each of the plurality of types of preprocessing in order on the reconfigurable circuit, (ii) causing each reconfigured prestage circuit to execute corresponding preprocessing, (iii) storing the processing result of each prestage circuit in memory, (iv) after completion of the processing of each prestage circuit, reconfiguring a poststage circuit for executing the postprocessing on the reconfigurable circuit, (v) inputting the processing result of each prestage circuit stored in the memory into the reconfigured poststage circuit, and causing the circuit to execute processing and (2) a second implementation system for reconfiguring each prestage circuit, the poststage circuit, and synchronizing circuit for synchronizing when the processing result of each prestage circuit is input to the poststage circuit on the reconfigurable circuit at the same time, and operating them. The implementation section implements the implementation target processing using the reconfigurable circuit in a selected one of the implementation systems. The control section determines which of the implementation systems is to be adopted based on an estimation value of time required for processing data of a specified data amount when each of the implementation systems is adopted and a circuit scale of the circuits reconfigured at the same time on the reconfigurable circuit in the implementation system. The control section commands the implementation section to implement in the determined implementation system.

BRIEF DESCRIPTION OF THE DRAWINGS

Exemplary embodiment(s) of the present invention will be described in detail based on the following figures, wherein.

DETAILED DESCRIPTION

To begin with, the basic concept of reconfiguration control of a reconfigurable circuit in an exemplary embodiment will be discussed with reference to a specific example.

Figure 1:
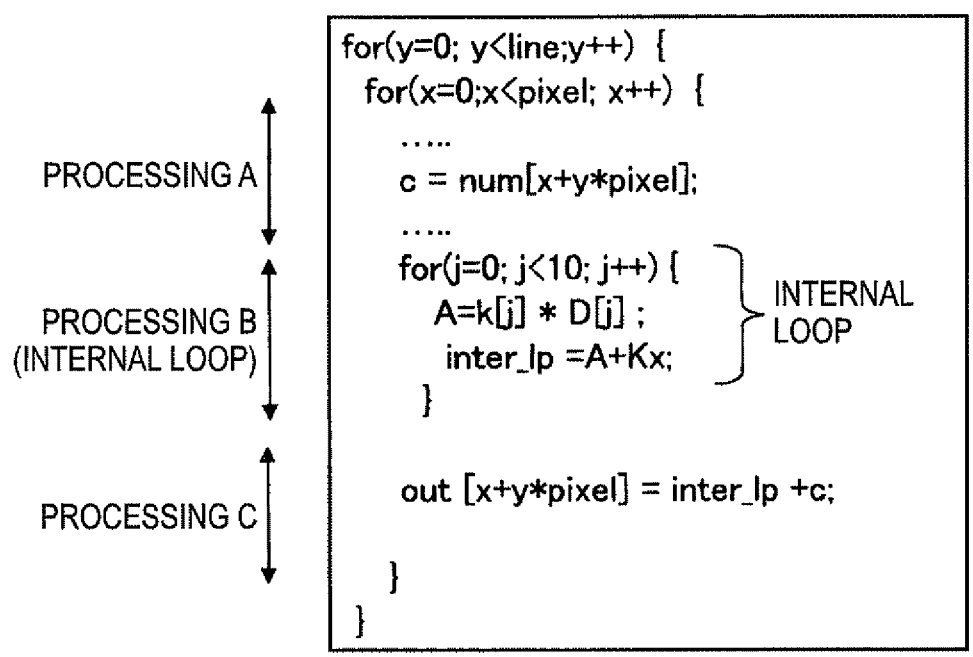
FIG. 1 is a drawing to show an example of source code of processing to be implemented using a reconfigurable circuit (portion relating to particularly a technique of an exemplary embodiment)

FIG. 1 shows an example of source code of processing to be implemented using the reconfigurable circuit (namely, processing to which implementation system selection control of the exemplary embodiment applies; the processing will be hereinafter called implementation target processing). This example describes a processing example of image data in a raster scan format in a C language; only a portion required particularly for the description of control of the exemplary embodiment is displayed.

In the code, y indicates the pixel position (coordinate) in a subscanning direction of raster scan, a constant "line" indicates the image width in the subscanning direction (namely, the total number of lines of the image). x indicates the pixel position in a main scanning direction and a constant "pixel" indicates the image width in the main scanning direction (namely, the total number of pixels of one line). Therefore, the pixels in one line are scanned (main-scanned) in order according to a loop of incrementing the second x from the outside by one from 0 to the upper limit, and the main scan is repeated as many as the number of lines according to a loop of incrementing the outermost y by one from 0 to the upper limit, whereby the target image is processed one pixel at a time in the raster scan order. That is, the pixels to be processed are switched one at a time in the raster scan order in the outer two loops. Substantive processing for the image is described in the loop of the raster scan.

In the example, the substantive image processing can be separated into three parts of processing A, B, and C as shown in the figure. The processing A contains processing of assigning the value (for example, the pixel value; this value is previously registered in an array of num [ ]) relevant to the current pixel to be processed (namely, the (x+y*pixel)th pixel in the raster scan order) to a variable c. The processing is once executed each time x is incremented by one in the second for loop from the outside.

The processing B is a for loop about a variable j and will be hereinafter called internal loop in the sense of a loop in the loop of raster scan. The processing B calculates a correction value inter_lp responsive to the x coordinate of the current pixel to be processed. For the calculation, processing is repeated while j is incremented in order from 0 to 9 and thus 10 calculations become necessary to obtain processing result inter_lp for one pixel. In the processing A, one calculation may be performed to obtain processing result c for one pixel and thus the processing B performs calculation 10 times that of the processing A per pixel.

The processing C is processing of assigning the value provided by adding the processing result inter_lp of the processing B and the processing result c of the processing A to the (x+y*pixel)th pixel corresponding to the current pixel to be processed in the array of num [ ] as output of the implementation target processing. The processing C performs one computation for each pixel (namely, each time x is incremented by one in the second loop from the outside) and the number of computations per pixel is the same as that of the processing A.

Figure 2:
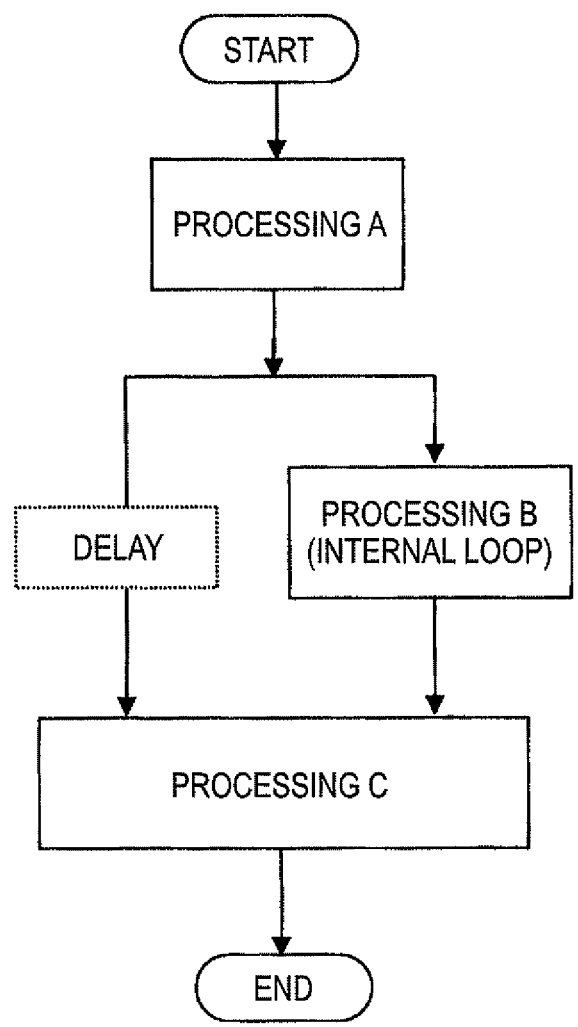
FIG. 2 is a drawing to show schematically shows a flow of processing A, B, and C in the source code illustrated in FIG. 1.

FIG. 2 schematically shows a flow of processing A, B, and C in the source code illustrated in FIG. 1 As shown in FIG. 2, in the processing C, the processing results of the preceding two processing A and processing B are merged. The processing A and the processing B differ in the number of processing times required per pixel, 10 times as described above. If the processing A and the processing B are executed in accordance with the same clock at the same time, while the processing B calculates the processing result of one pixel, the processing A can calculate the processing result of 10 pixels. Thus, the processing A and the processing B differ in the time required for obtaining the processing result about one pixel (in other words, the processing rate). Thus, the relationship between processing and processing different in the time required for obtaining the processing result about the same processing unit (in the example, pixel) (namely, number of calculations) is called "asynchronous." If no internal loop exists in the other processing although an internal loop exists in one processing to find the processing result about the same processing unit as in the illustrated processing A and processing B, the relationship between them is asynchronous. Although an example of the for statement is shown in FIG. 1, the syntax of describing an internal loop is not limited to the for format and may be any other format of do-while format, etc. As another example, an image is enlarged in one processing; whereas an image is not enlarged and is processed as the full size in the other processing. In this case, the number of pixels of the former becomes is larger than that of the latter and thus the relationship becomes asynchronous. If data is thinned out or is reduced in one processing and is processed as the full size in the other processing, likewise the relationship becomes asynchronous. Control of the exemplary embodiment described below can be applied to a general case where processing at the following stage receives the processing result in such asynchronous relationship from a plurality types of processing at the preceding stage and synchronous processing is performed. However, in the description to follow, to simplify the description, the case where asynchronous relationship as described above occurs as a result of containing an internal loop in implementation target processing is taken as a representative example.

In the example in FIG. 1, it can be said that the processing A and the processing B are asynchronous, but the processing A and the processing C are synchronous.

On the other hand, in the processing C, the processing results of the processing A and the processing B in the asynchronous relationship are synchronized (merged) for each pixel. Therefore, for example, if the processing A, the processing B, and the processing C are configured on one circuit, the processing result of the processing A needs be delayed as shown in FIG. 2 to synchronize the processing result of the processing A and the processing result of the processing B are synchronized in input of the processing C. If the delay amount is large, a large number of circuit elements (PE: Processor elements) become necessary to reconfigure a circuit for the delay on reconfigurable circuit and the case where reconfiguration cannot be performed as one configuration on the reconfigurable circuit also appears. In the Specification, the term "configuration" is used to mean logical circuits existing at the same time on the reconfigurable circuit. If the internal loop of the processing B is provided with a point exiting the loop in response to a condition, such as a Break statement, the number of times the internal loop is executed varies for each processing unit and thus it is also considered that the delay amount required for synchronizing the processing result of the processing A and the processing B varies for each processing unit.

In the exemplary embodiment, to implement the processing A, the processing B, and the processing C in the relationship described above using a reconfigurable circuit such as a DRP (Dynamic Reconfigurable Processor), an optimum system under the required condition is automatically selected from among different implementation systems.

Figure 3:
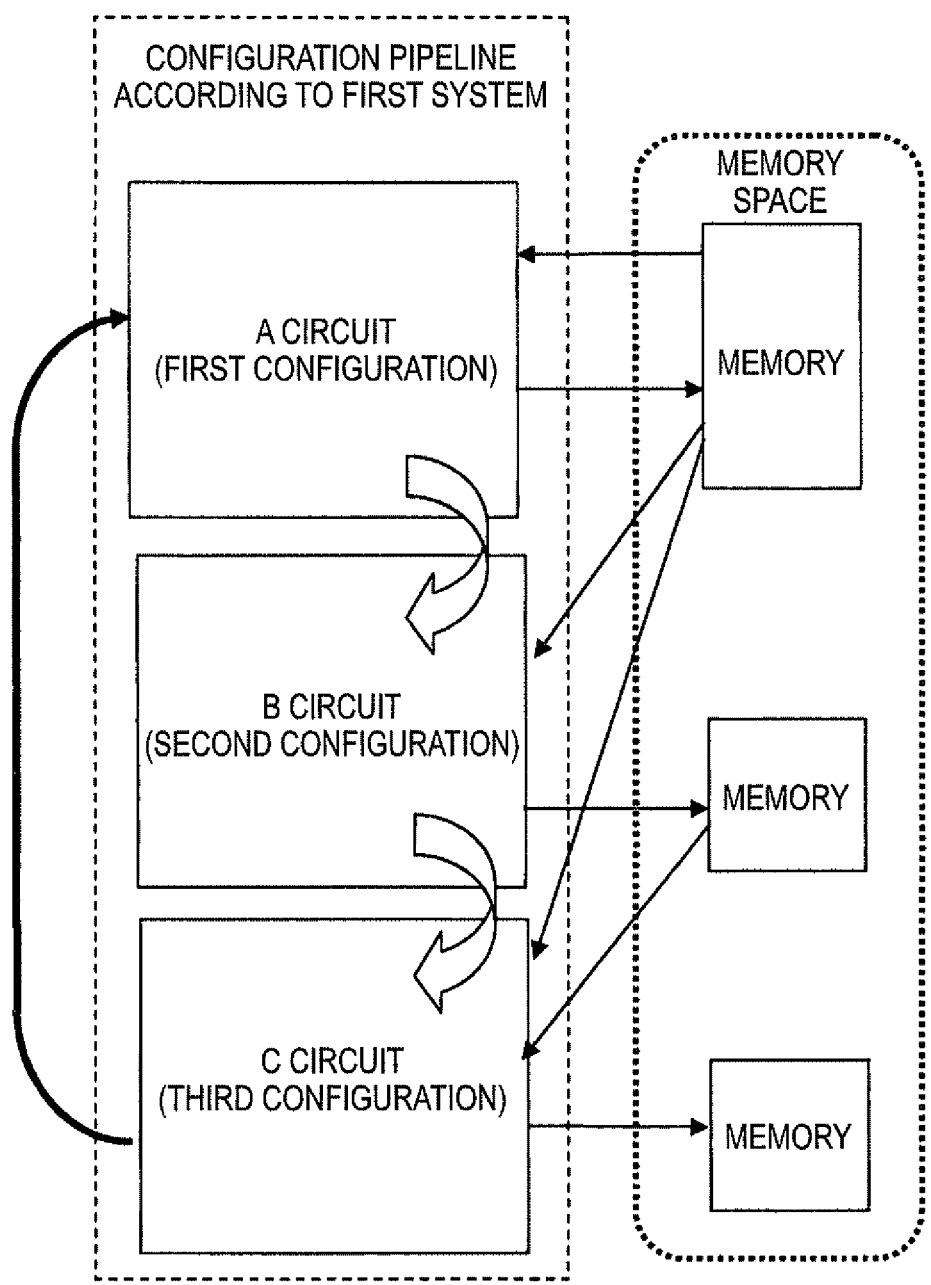
FIG. 3 is a drawing to describe how to implement a first system.

FIG. 3 shows a first system of the implementation systems. In the first system, the processing A, the processing B, and the processing C are separate configurations (in the figure, described a "A circuit," "B circuit," and "C circuit") and logical circuits on a reconfigurable circuit are rewritten in the order of the A, B, and C circuits.

That is, first the A circuit is written into the reconfigurable circuit (namely, the A circuit is reconfigured on the reconfigurable circuit) and input data is supplied to the A circuit from memory, whereby the A circuit is caused to perform processing and write the processing result into the memory.

When the A circuit terminates one processing unit (data of a predetermined amount, such as a pixel, a line, or a band, for example), the reconfigurable circuit is rewritten to the B circuit and the processing result of the A circuit is input to the B circuit and the B circuit is caused to perform processing. The B circuit may contain a substance processing portion for executing processing in the internal loop of the processing B and a control portion for performing loop execution of the processing portion as many times as the number of loop times, for example. When the B circuit terminates loops as many times as the specified number of loop times, the processing result is written into memory. Not only the final processing loop, but also the processing result for each loop may be written into the memory and may be read from the memory in the next loop.

When processing of the B circuit about one processing unit thus terminates, the reconfigurable circuit is rewritten to the C circuit and the processing result of the A circuit and the processing result of the B circuit are input to the C circuit and the C circuit is caused to perform processing. The result of the processing is written into the memory as the processing result of the whole implementation target processing. FIG. 3 displays the same "memory," but memory for holding input data to the A circuit, memory for holding the processing result of A circuit, memory for holding the processing result of B circuit, and memory for holding the processing result of C circuit may be physically the same memory or may be physically different memories. For example, the input data to the A circuit and the final processing result of the implementation target processing may be held in memory included in a high-order apparatus for causing the reconfigurable circuit to execute processing (in an example in FIG. 9 described later, main memory 22) and the processing results of the A circuit and the B circuit of intermediate data of the implementation target processing may be held in memory embedded in the same chip as the reconfigurable circuit (or mounted on the same board) (in the example in FIG. 9, local memory 36).

When the C circuit terminates processing about one processing unit, if the data to be processed remains, the reconfigurable circuit is again rewritten to the A circuit and the rewrite and processing execution described above are repeated.

As described above, in the first system, the processing A and the processing B in asynchronous relationship with each other and the processing C of synchronously processing the processing result of both are separate configurations and a time-series pipeline is formed in the order of A, B, and C among the configurations. In the system, the C circuit is started after termination of processing of both of the A circuit and the B circuit and thus synchronization of the processing results of the A circuit and the B circuit is naturally accomplished. Thus, to implement one implementation target processing by switching one or more configurations in time series, the sequence of the one or more configurations is called configuration pipeline.

Next, a second implementation system (called "second system") will be discussed with reference to FIG. 4. In the second system, processing A, processing B, and processing C are implemented as one configuration. That is, the configuration pipeline in the second system is made up of only one configuration.

In the example in FIG. 1, the processing A and the processing C are synchronous with each other and the processing B is asynchronous with the processing A and the processing C. Thus, in the example in FIG. 4, the A circuit and the C circuit are shown as one circuit block and the B circuit (internal loop) is shown as a separate circuit block. To absorb asynchronism between the A circuit and the B circuit, an FIFO (first-in, first-out) circuit is provided between output of the A circuit and the B circuit and between output of the B circuit and the C circuit. Input data is supplied to the A circuit from the memory. The input data is processing by the A, B, and C circuits and the processing result is written into the memory.

Figure 4:
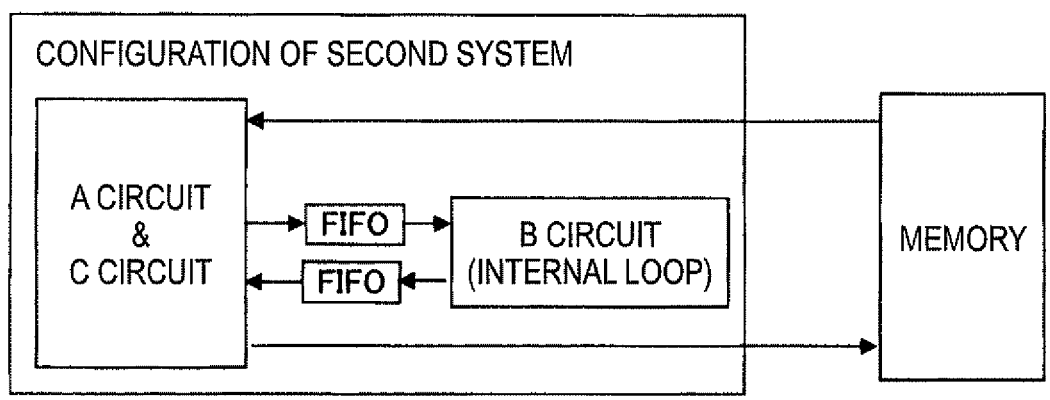
FIG. 4 is a drawing to describe how to implement a second system.
Figure 5:
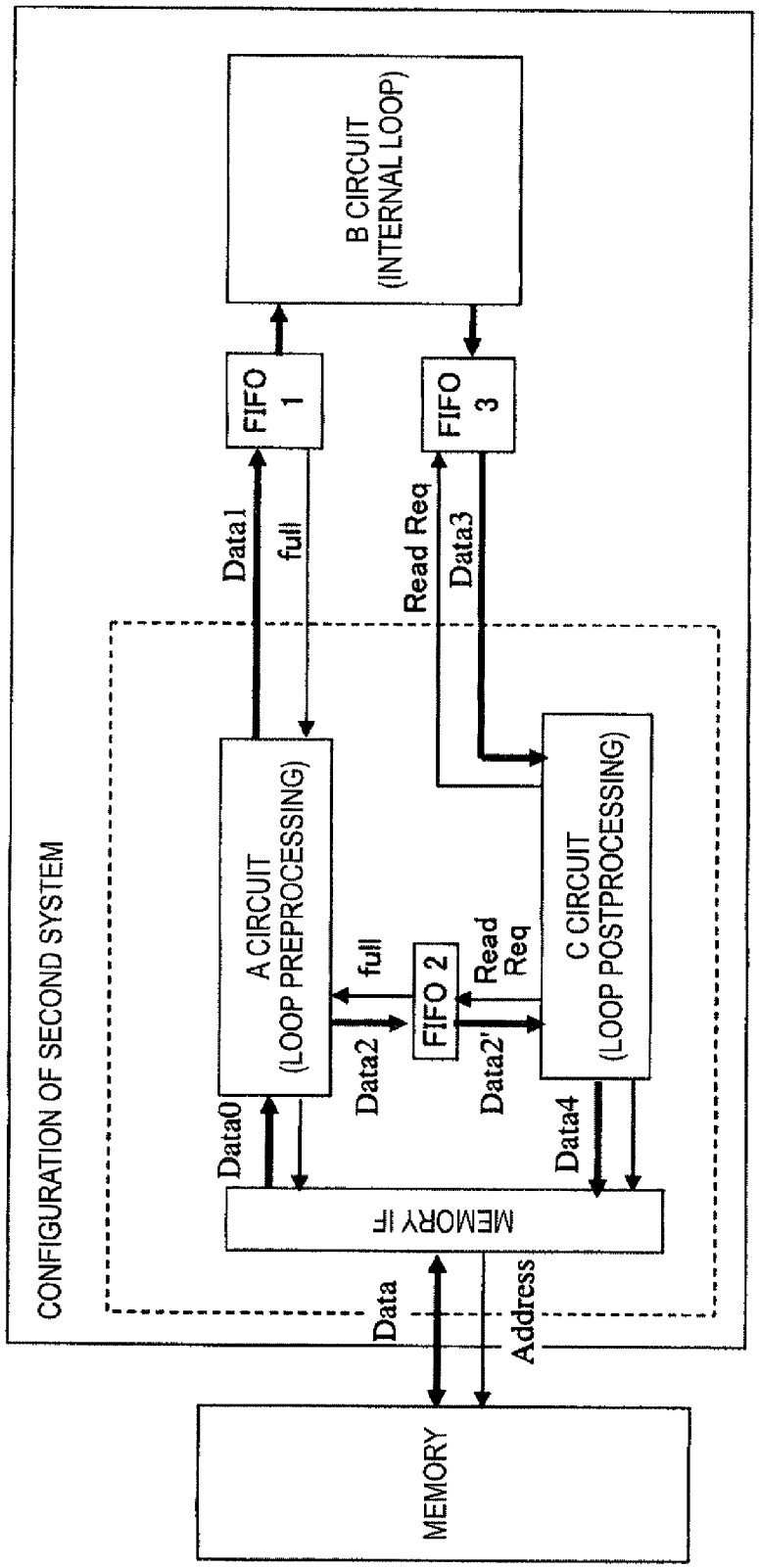
FIG. 5 is a drawing to show the circuit configuration of the second system in more detail.

The internal configuration of the configuration of the second system illustrated in FIG. 4 is shown in detail in FIG. 5. FIG. 4 shows the A circuit and the C circuit in one block; in fact, however, the A circuit and the C circuit are formed as separate circuits and FIFO for synchronization is provided between both the circuits as shown in FIG. 5. Therefore, in the configuration of the second system, first FIFO ("FIFO1" in the figure) is provided between the A circuit and the B circuit, second FIFO ("FIFO2" in the figure) is provided between the A circuit and the C circuit, and third FIFO ("FIFO3" in the figure) is provided between the B circuit and the C circuit. The A circuit is connected to memory through a memory IF (interface) and receives input data Data0 (in the example, image data) from the memory. Processing result Data1 of the A circuit is written into the FIFO1. When the FIFO1 becomes full, the FIFO1 issues a "full" signal indicating that the FIFO1 becomes full. Upon reception of the full signal, the A circuit stops the processing (therefore, stops output of the processing result) and also stops read of the input data from the memory. The A circuit also performs processing of calculating the processing result directed to the C circuit and outputs processing result Data2 (the value of the variable c in FIG. 1) to the FIFO2. When the FIFO2 becomes full, the circuit A stops the processing as the FIFO1 becomes full. Thus, when at least one of the FIFO1 and FIFO2 is full, the A circuit stops the operation. When both the FIFO1 and FIFO2 do not become full (namely, do not issue a full signal), the A circuit restarts the operation.

Upon reception of a read request (Read Req) signal (not shown) from the B circuit, the FIFO1 outputs the held data in order starting at the top to the B circuit. As the data is output, when the FIFO1 does not become full, the FIFO1 stops output of the full signal. The B circuit executes processing of an internal loop for the data input from the FIFO1. The processing result is written into the FIFO3. When the FIFO3 becomes full, a full signal is issued and the B circuit stops the processing in response to the full signal. Since the internal loop exists, processing of the B circuit is slower than that of the C circuit at the later stage and thus in fact it is hard to occur for the FIFO3 to become full.

The C circuit sends a read request (Read Req) signal to the FIFO2 and the FIFO3. The FIFO2 and the FIFO3 supplies the top of the held data to the C circuit in response to the signal (Data2' and Data 3). The C circuit executes computation of the processing C in FIG. 1 for the data received from both the FIFO2 and the FIFO3 by a hardware circuit and writes the computation result Data4 to the memory through the memory IF.

Figure 6:
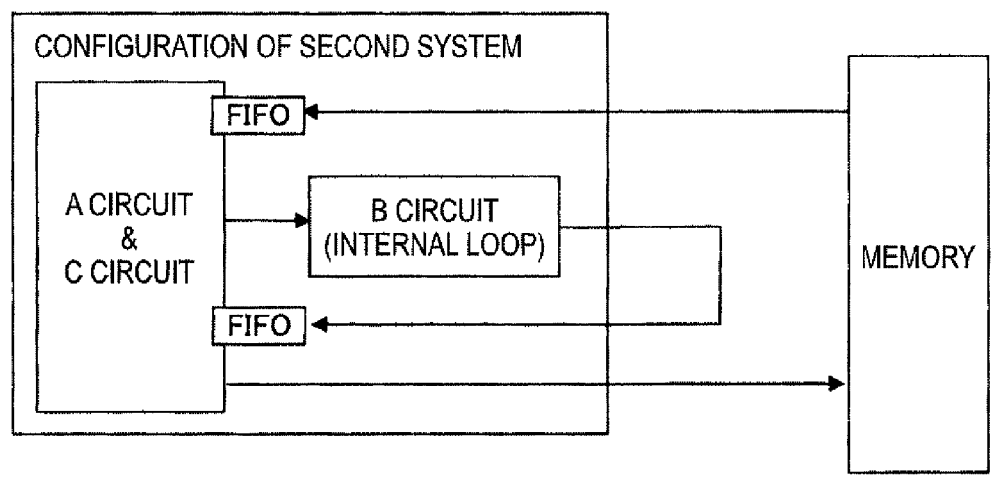
FIG. 6 is a drawing to describe another example of the second system.

The second system is not limited to the configuration as in FIG. 4 and may be a configuration as shown in FIG. 6. In the configuration in FIG. 6, FIFO for holding data input from the memory to the A circuit is provided, but FIFO is not provided between the A circuit and the B circuit. FIFO is provided between output of the B circuit and the C circuit as with the case in FIG. 4.

In the second system described above, the circuits for the processing (A, B, and C circuits) and the FIFO1 to FIFO3 are built in one configuration. Therefore, the area occupying on the reconfigurable circuit is large in the second system as compared with the first system wherein the A, B, and C circuits are separate configurations. If it is assumed that a circuit for performing processing other than the implementation target processing illustrated in FIG. 1 is concurrently placed (reconfigured) on the reconfigurable circuit, it is desirable that occupation area of the implementation target processing should be small. Therefore, the first system is better than the second system from the viewpoint of simultaneous occupation area on the reconfigurable circuit, namely, the circuit scale.

On the other hand, from the viewpoint of processing speed, in the first system, the reconfigurable circuit needs to be rewritten from A to B, from B to C from C to A for each processing unit and the rewrite time is required in addition to the time required for the implementation target processing. In contrast, in the second system, if the configuration In FIG. 4 (FIG. 5) is once configured in the reconfigurable circuit, rewrite is not required until completion of processing of all data. Therefore, the second system is better than the first system from the viewpoint of processing speed.

Figure 7:
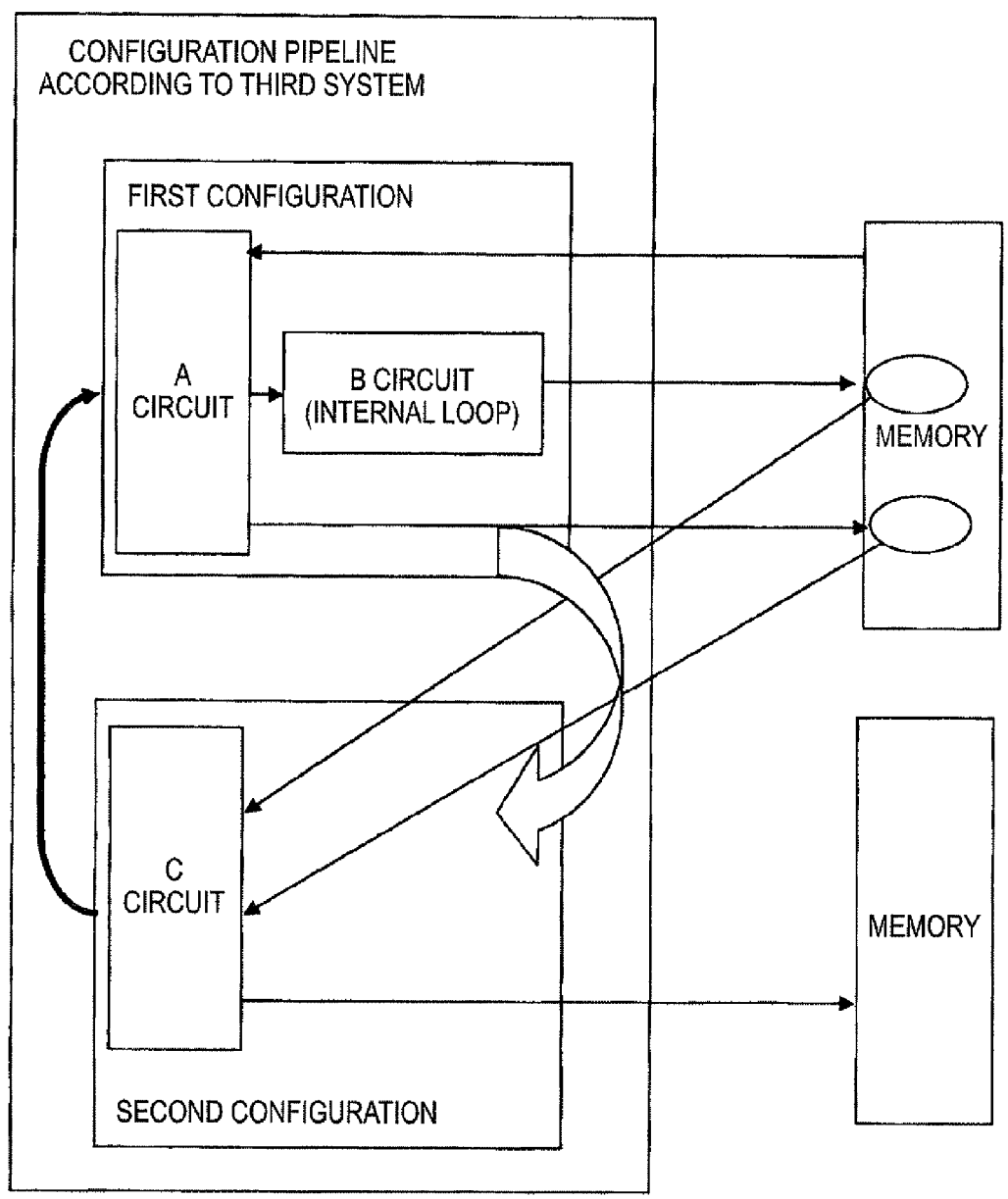
FIG. 7 is a drawing to describe how to implement a third system.

In the exemplary embodiment, a configuration of a third system shown in FIG. 7 may be provided as a compromise of the first system and the second system described above. As shown in FIG. 7, in the third system, in the processing A, B, and C in FIG. 1, the processing A and the processing B are built in the first configuration and the processing C is built in the second configuration and these two configurations are operated while they are alternately switched as a time-series pipeline. The processing results of the A circuit and the B circuit in the first configuration are written into memory and the C circuit reads and processes the processing results in the memory. If the processing of the C circuit terminates, when data to be processed remains, the reconfigurable circuit is rewritten to the first configuration and the processing is continued. In the system, like the first system, the C circuit is started after termination of processing of both of the A circuit and the B circuit and thus synchronization of the processing results of the A circuit and the B circuit is naturally accomplished.

The number of configurations of the third system is between that of the first system and that of the second system and thus the processing speed and the circuit scale of the third system are also between those of the first system and those of the second system.

If the target performance cannot be accomplished in any of the first to third systems described above, a system for speeding up processing by parallelizing the configurations of the first to third systems may be provided as a fourth system. That is, one or more configurations in the configuration pipelines of each of the first to third systems or one or more element circuits in the configuration (for example, the A circuit, B circuit, etc., described above) are parallelized. The circuits may be parallelized by configuring the circuits at the same time on the reconfigurable circuit and causing the circuits to concurrently process different portions of the data to be processed. The user may previously determine which configurations in the configuration pipeline or which element circuits are to be parallelized for each of the first to third systems and the configurations or the element circuits to be parallelized may be selected according to the setting (determination) (described later in detail).

The four systems of the first to fourth systems are illustrated as the implementation system of the implementation target processing, but further another system may be provided, of course.

In the exemplary embodiment, control is performed for automatically selecting the appropriate implementation system in response to the use conditions from among the implementation systems different in the processing speed and the circuit scale. The use conditions are the resources of a reconfigurable circuit that can be assigned to the implementation target processing (for example, the number of PEs, the number of input/output streams (buffers), etc., that can be assigned), the size of the data to be processed (data amount), the target performance (for example, the target time of processing the data to be processed), etc., for example. The control configuration will be discussed below:

First, an apparatus for creating configuration data defining the configuration pipeline of each system described above will be discussed with reference to FIG. 8.

The apparatus includes a source code input section 10, a source code analysis section 12, a configuration data generation section 14, and a circuit configuration rule storage section 16. The source code analysis section 12 accepts input of source code of implementation target processing described in a program language such as C or C++. The source code analysis section 12 analyzes the input source code and the configuration data generation section 14 generates configuration data defining a configuration pipeline to realize the processing represented by the source code in a reconfigurable circuit in accordance with the analysis. A tool for analyzing the source code and generating configuration data representing the processing represented by the source code exists conventionally and in the exemplary embodiment, an equivalent tool to such a conventional tool may be used. However, in the exemplary embodiment, the configuration data generation section 14 does not create one configuration data from one source code and generates one or more pieces of configuration data for each of the implementation systems containing the first to fourth systems described above. Thus, the circuit configuration rule storage section 16 stores configuration rules for each of the implementation systems containing the first to fourth systems.

Figure 8:
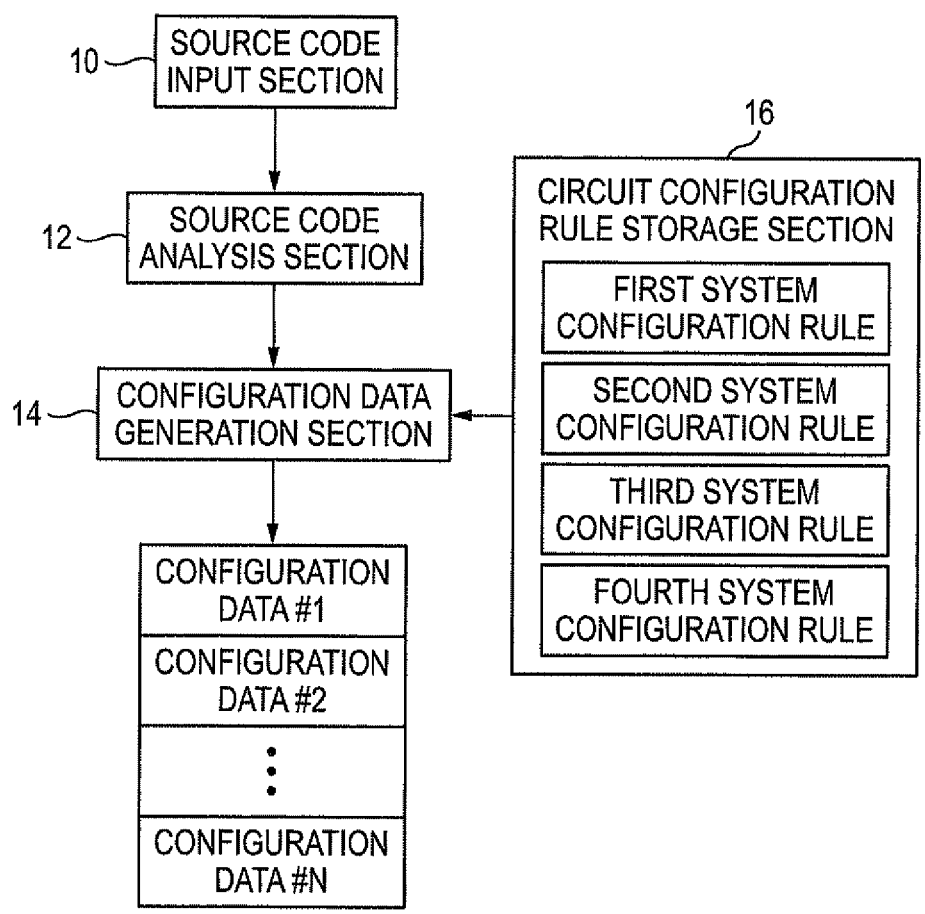
FIG. 8 is a function block diagram of an example of an apparatus for creating a configuration pipeline of each system.

The configuration data generation section 14 generates configuration data about each of the first to fourth systems in accordance to each configuration rule. In FIG. 8, identification numbers #1, #2, . . . , #N are given to the generated configuration data pieces. Information indicating which system the configuration data piece corresponds to is added to each configuration data piece.

The apparatus in FIG. 8 can be realized by installing programs and data representing the functions of the source code input section 10, the source code analysis section 12, the configuration data generation section 14, and the circuit configuration rule storage section 16 in a computer such as a personal computer or a workstation, for example. The configuration data generated by the apparatus is provided for a system using a reconfigurable circuit. The system using the reconfigurable circuit may be different hardware from the apparatus in FIG. 8 or may also have the functions of the apparatus in FIG. 8.

Figure 9:
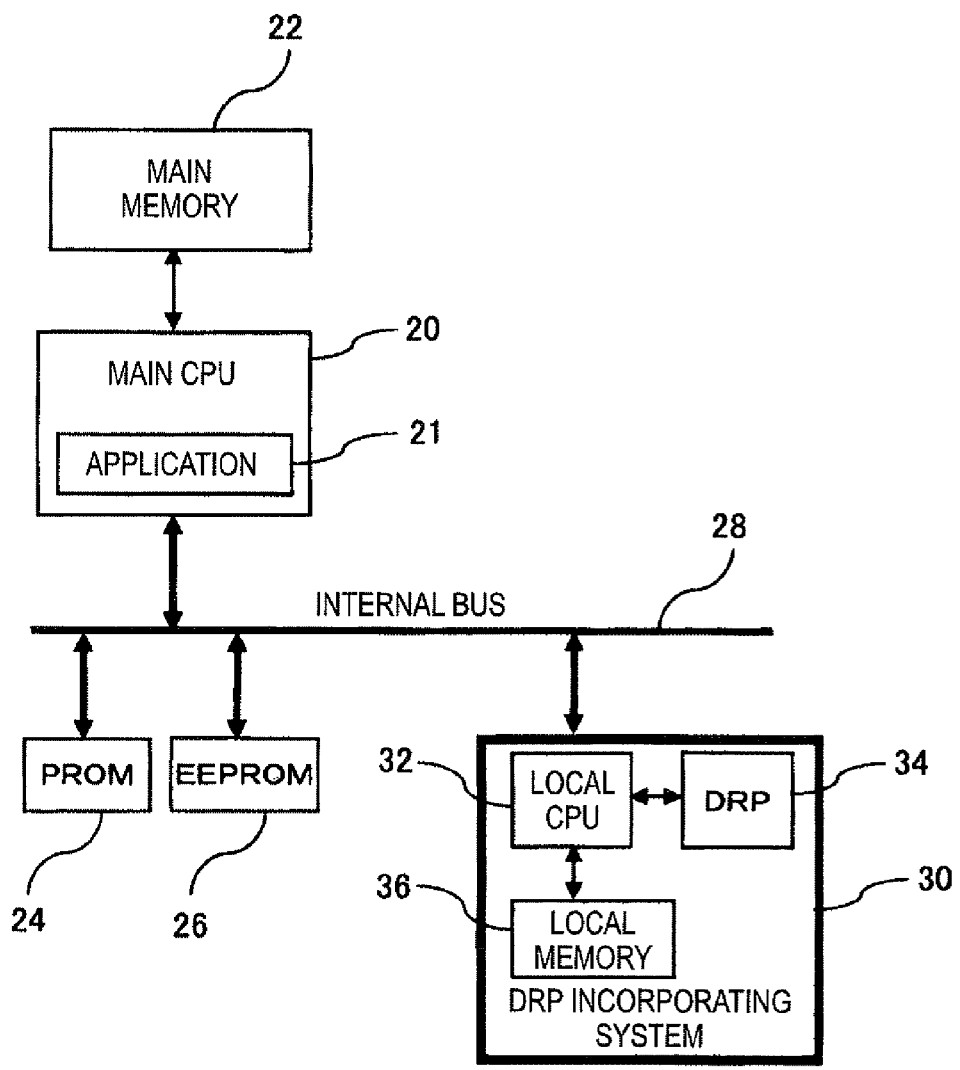
FIG. 9 is a drawing to show an example of a system for performing processing using an incorporated reconfigurable circuit.

FIG. 9 shows an example of a system for performing processing using an incorporated reconfigurable circuit. The system includes a main CPU (central processing unit) 20, main memory 22, PROM (Programmable Read-Only Memory) 24, EEPROM (Electrically Erasable PROM) 26, and a DRP incorporating system 30, which are connected to an internal bus 8. The system is an example of using DRP as a reconfigurable circuit.

The system executes one processing using an application 21 executed by the main CPU 20 and a configuration reconfigured to the DRP incorporating system 30 in combination. In other words, a portion of the processing suited for execution of hardware is implemented in the DRP incorporating system 30 as implementation target processing. The main memory 22 is memory used when the application 21 is executed. The PROM 24 and the EEPROM 26 store programs of the application 21, etc., executed by the main CPU 20 and data such as setup information used in the program. The data of the setup information, etc., and programs which are rewritten are stored in the EEPROM 26.

The DRP incorporating system 30 is provided by mounting a local CPU 32, a DRP 34, and local memory 36 on one chip or one board, for example. The DRP 34 is an example of a reconfigurable circuit. The local CPU 32 performs control of reconfiguration, etc., of the DRP 34. The local memory 36 stores data and programs for control processing executed by the local CPU 32.

Figure 10:
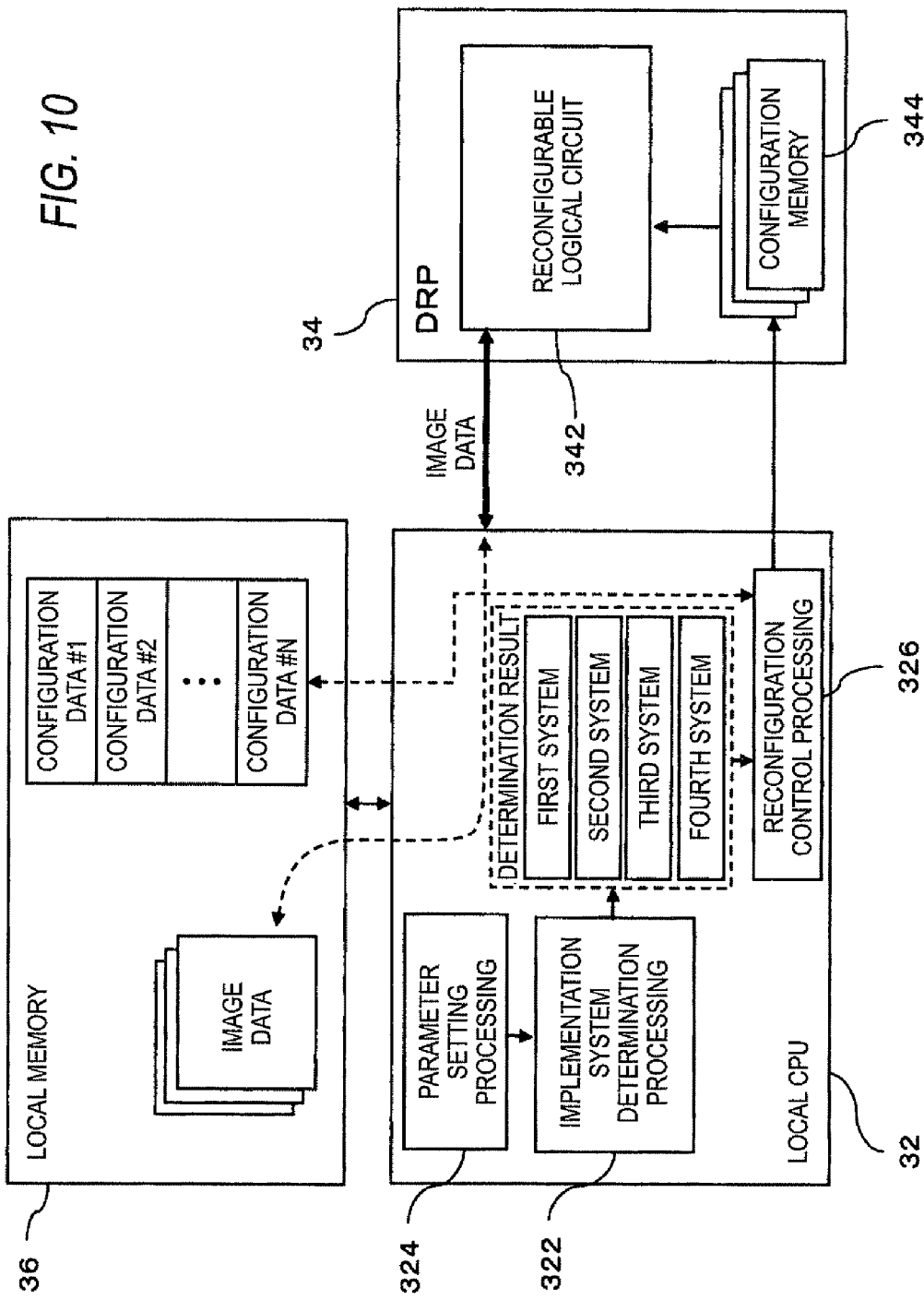
FIG. 10 is a drawing to describe the function configuration of a DRP incorporating system of an exemplary embodiment.

Next, the function configuration of the DRP incorporating system 30 of the exemplary embodiment will be discussed with reference to FIG. 10.

The local memory 36 stores configuration data #1 to configuration data #N corresponding to the first to fourth systems, created by the apparatus in FIG. 8. Since the example assumes use of the DRP incorporating system 30 for image processing for page print, one or more types of image data input from the main CPU 20 (or the main memory 22) as the processing target, image data output as an intermediate process by the DRP 34, and image data output by the DRP 34 as the processing result of implementation target processing may be temporarily held in the local memory 36.

The DRP 34 includes a reconfigurable logical circuit 342 containing a large number of PEs and wiring resources among the PEs and a plurality of configuration memories 344. One configuration memory 344 stores data defining one configuration. In the DRP 34, if one of the configuration memories 344 is made effective (active), the PEs and wiring in the reconfigurable logical circuit 342 are rearranged in accordance with the data held in the memory 344 and a circuit of the configuration is configured on the reconfigurable logical circuit 342. Only one configuration memory 344 is active at one point in time and another configuration memory 344 is made active, the configuration of the reconfigurable logical circuit 342 is switched. For example, the configurations making up a configuration pipeline representing implementation target processing are loaded into the different configuration memories 344 and are made active in order, whereby the reconfigurable logical circuit 342 can be caused to execute implementation target processing. While one configuration memory 344 is made active, data is loaded into another configuration memory 344, the time required for the loading is concealed.

The local CPU 32 executes implementation system determination processing 322 before the DRP 34 is caused to execute implementation target processing. The implementation system determination processing 322 is processing of selecting the implementation system of implementation target processing to the DRP 34 from among the implementation systems described above. The selection (determination) processing is performed considering the use conditions (for example, one or more of the resource of the reconfigurable circuit assigned to the implementation target processing, the size of the data to be processed, the target processing, etc.,). The use conditions are set through parameter setting processing 324 from the user (system designer attempting to cause the system to perform processing or the like). Parameters set by the user are the amount of the data to be processed, the objective processing time assigned to processing of the data, namely, the upper limit processing time, etc. For example, to perform image processing for print for the page image to be printed (for example, color space conversion, filtering, scaling up and down, rotation, data compression and decompression, etc.,), the data amount of an image of one page (for example, the number of pixels, etc.,) may be set as the amount of the data to be processed. In this case, to realize the print speed of a printer installing the system, the upper limit time given to process the image of one page by the system may be set as the objective processing time. Processing needs to be performed for the image of one page using the DRP 34 in addition to the implementation target processing, the objective processing time that can be assigned to the implementation target processing becomes the time of a part of the upper limit time given to process the image of one page by the system.

A specific example of a processing procedure of the implementation system determination processing 322 based on the setup parameters is described later.

Reconfiguration control processing 326 reads the configuration data corresponding to the implementation system determined (selected) by the implementation system determination processing 322 from the local memory 36 and controls reconfiguration of the DRP 34 in accordance with the data. That is, data of each configuration contained in the configuration data corresponding to the selected implementation system is loaded into each configuration memory 344 of the DRP 34 and the memories 344 are made active in order, whereby the configurations are configured on the reconfigurable logical circuit 342 in order.

The programs representing the implementation system determination processing 322, the parameter setting processing 324, and the reconfiguration control processing 326 are installed in the PROM 24 or the EEPROM 26 or storage (not shown) in the DRP incorporating system 30.

Next, an example of a processing procedure of the implementation system determination processing 322 will be discussed with reference to FIGS. 11 and 12. The procedure may be executed when the DRP incorporating system 30 starts implementation target processing, for example.

In this procedure, the implementation system determination processing 322 reads source code in order until an internal loop is detected (S110). When detecting an internal loop (S100), the implementation system determination processing 322 goes to S102. In the example in FIG. 1, the raster scan loop exists on the outermost side of the implementation target processing, the loop is excluded from the target of the determination processing 322. At S102, the implementation system determination processing 322 determines whether or not the detected loop S102 is an initialization loop. The initialization loop is a loop which may be once executed to initialize the DRP incorporating system 30 and is not repeated as a data processing loop is repeated (for example, each time one page is processed) and thus they are distinguished from each other for special processing. For example, the creator of the source code may state explicitly that the loop is an initialization loop in the source code in a comment statement, etc., for example, and if the implementation system determination processing 322 detects it, it may determine that the loop is an initialization loop. If the detected loop is an initialization loop, the number of loop times of the loop is found from the source code and if the number of times is equal to or more than predetermined threshold value TH-in, initialization configuration for processing of the initialization loop is adopted as the first configuration of the configuration pipeline corresponding to the source code (S106). If the number of loop times is less than TH-in, it does not take much time in software processing and thus the initialization loop is assigned to processing executed by the local CPU 32 (S108). The initialization loop may previously created in creation processing of the configuration data of each implementation system illustrated in FIG. 8. In the creation processing of the configuration data of each implementation system illustrated in FIGS. 8, S102 to S108 may be executed and the result (data of initialization configuration or information indicating that the local CPU 32 performs software processing) may be built in the configuration data.

If the implementation system determination processing 322 determines at S102 that the loop detected at S100 is not an initialization loop, then the implementation system determination processing 322 compares the number of loop times of the loop with predetermined threshold value TH-cy (generally a value different from the determination threshold value of the initialization loop, TH-in) (S112). If the number of loop times is equal to or less than TH-cy, configuration representing processing of inline expansion of the loop is adopted (S114). The inline expansion is to write down processing in the loop as many as the number of loop times, thereby eliminating the loop. The configuration of the inline expansion result may be previously created in the creation processing of the configuration data of each implementation system illustrated in FIG. 8. In the creation processing of the configuration data of each implementation system illustrated in FIG. 8, S112 may be executed and for the loop whose number of loop times is equal to or less than TH-cy, the configuration of the inline expansion result may be created and be built in the configuration data. If a control statement for forcibly exiting the loop such as a Break statement exists in the loop, inline expansion is not performed.

If the implementation system determination processing 322 determines at S112 that the number of loop times exceeds TH-cy, the implementation system determination processing 322 first performs performance evaluation of the configuration pipeline when the loop and the code groups representing the processing preceding and following the loop are implemented in the first system (S116).

In the evaluation performance, the sum total of latency of configurations making up the configuration pipeline (in the example in FIG. 3, the A circuit, the B circuit, and the C circuit) is found throughout the pipeline and is multiplied by the data amount of the data to be processed (for example, the number of pixels of the image of one page for processing of the page image), thereby calculating the total number of cycles of processing executed by the pipeline. The latency is the time required for processing data of one unit (for example, one pixel) by the configuration. The apparatus in FIG. 8 already creates the loop and the configuration pipeline of the first system representing processing preceding and following the loop and circuit configuration of each circuit is already known and thus the value of the latency can be found from the circuit configuration according to a known method (or when the apparatus in FIG. 8 creates the data of the configuration pipeline of the first system, the value of the latency may be calculated). The amount of the data to be processed is given by the parameter setting processing 324.

The implementation system determination processing 322 divides the found total number of cycles by the internal frequency of the DRP 34, thereby calculating the time required for the configuration pipeline to process the data to be processed (called estimated processing time). The internal frequency of the DRP 34 is already known and, for example, may be set by the parameter setting processing 324. The implementation system determination processing 322 determines whether or not the found estimated processing time clears the objective processing time set by the user in the parameter setting processing 324 (for example, whether or not the time is equal to or less than the objective processing time).

If the estimated processing time clears the objective processing time at S116, it is determined at S118 that the objective performance is accomplished. In this case, further whether or not the number of streams used by the configuration pipeline of the first system is within the constraint range is determined (S120). The stream is input or output performed by the configuration configured on the DRP 34 from or to the outside (for example, access from the main CPU 20 or dynamic memory access to the main memory 22). Specifically, one stream is assigned to one of input/output buffers included by the DRP 34 and data is transferred through the buffer to and from the outside. Since the number of input/output buffers included by the DRP 34 is finite, constraint occurs. This constraint is the upper limit number of input/output buffers included by the DRP 34 to implementation target processing. When the DRP 34 performs any other processing concurrently, the number of streams assigned to the implementation target processing becomes less than the total number of input/output buffers included by the DRP 34. The constraint of the number of streams (upper limit value) is preset by the user in the parameter setting processing 324. At S120, whether or not the maximum value of the number of streams used by each of the configurations making up the configuration pipeline evaluated at S116 satisfies the constraint is determined. If the constraint is satisfied, the configuration pipeline evaluated at S116 accomplishes the objective performance and is operated in the DRP 34 without a problem and thus it is determined that the configuration pipeline is adopted (S122).

Then, the implementation system determination processing 322 determines whether or not processing terminates to the end of the source code (S124). If processing does not terminate, the process goes to the next code and S100 and the later steps are repeated.

Figure 12:
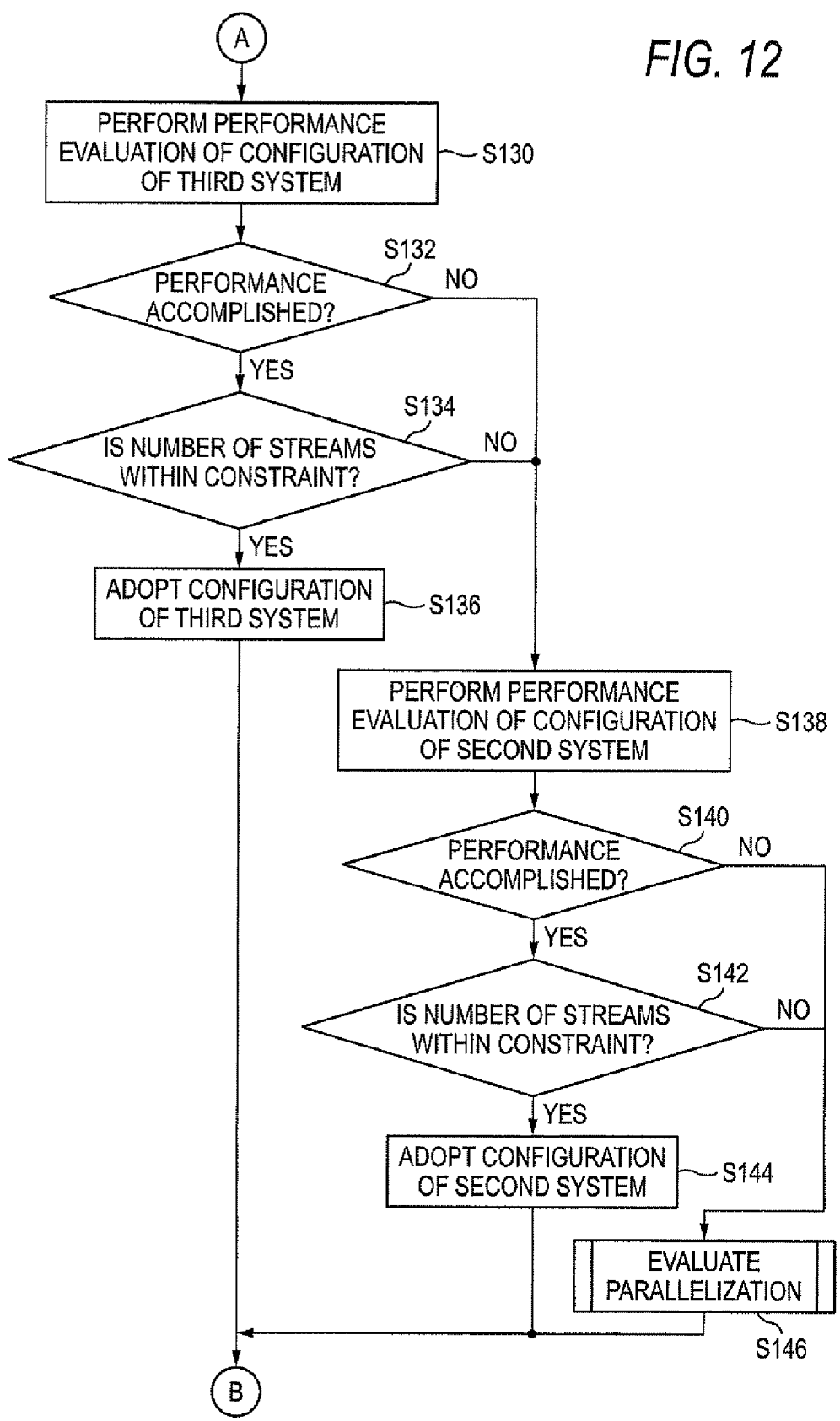
FIG. 12 is a flowchart to show the remaining part of the processing procedure example of the implementation system determination processing.

If the determination result at S118 or S120 is No (namely the objective processing time cannot be accomplished or the number of streams exceeds the constraint), the process goes to performance evaluation of the configuration of the third system as shown in FIG. 12.

That is, the implementation system determination processing 322 executes performance evaluation of the configuration pipeline when the loop and the code groups representing the processing preceding and following the loop are implemented in the third system as at S116 (S130). If the implementation system determination processing 322 determines that the objective performance can be accomplished at S132 and determines that the number of streams is within the constraint at S134, the implementation system determination processing 322 adopts the configuration pipeline of the third system (S136). The implementation system determination processing 322 goes to S124.

If the determination result at S132 or S134 is No, the process goes to performance evaluation of the configuration of the second system.

That is, the implementation system determination processing 322 executes performance evaluation of the configuration pipeline when the loop and the code groups representing the processing preceding and following the loop are implemented in the second system as at S116 (S138). If the implementation system determination processing 322 determines that the objective performance can be accomplished at S140 and determines that the number of streams is within the constraint at S142, the implementation system determination processing 322 adopts the configuration pipeline of the second system (S144). The implementation system determination processing 322 goes to S124.

If the determination result at S140 or S142 is No, the process goes to parallelization evaluation processing of the fourth system.

Figure 13:
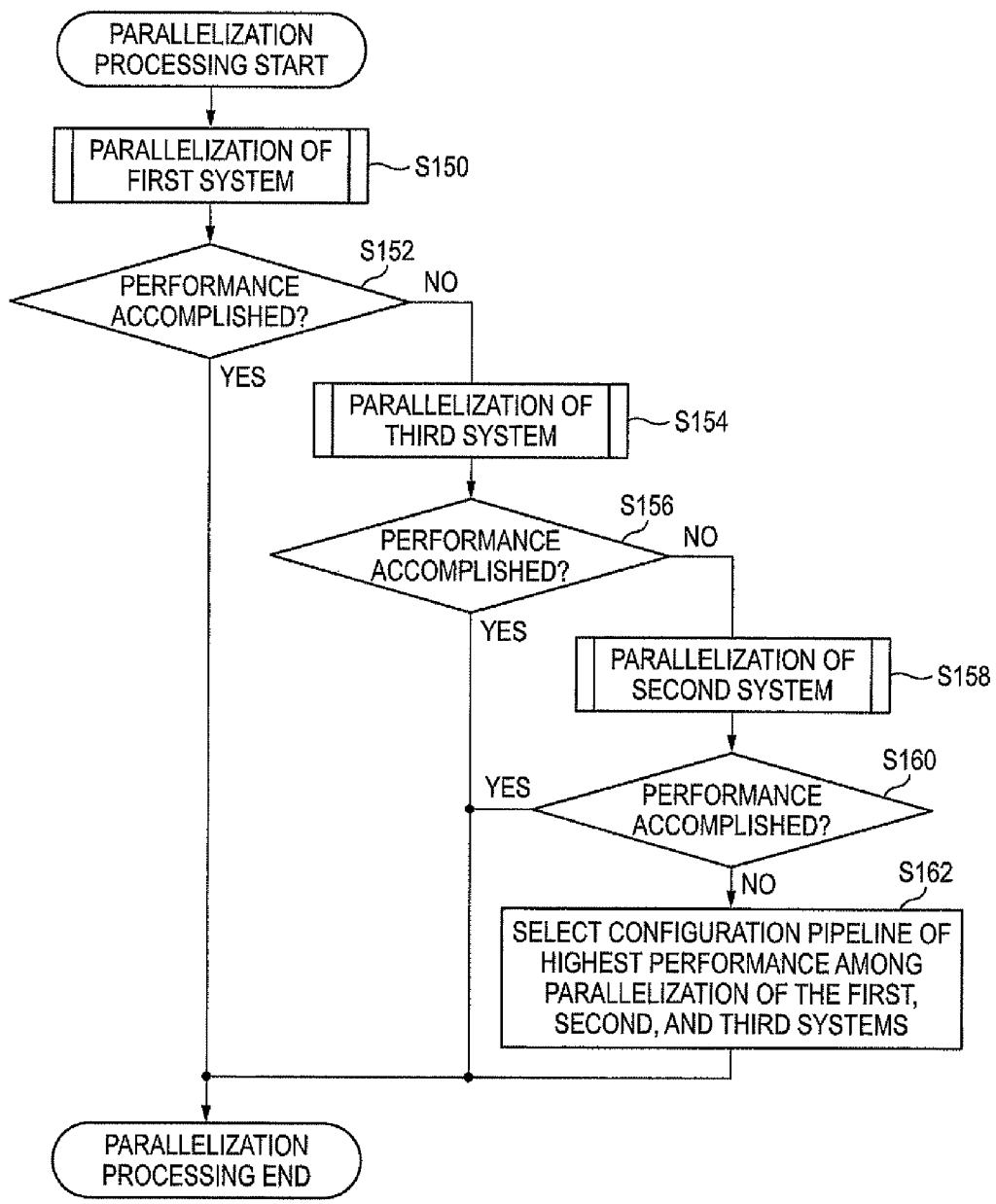
FIG. 13 is a flowchart to show a processing procedure example of parallelization processing.
Figure 14:
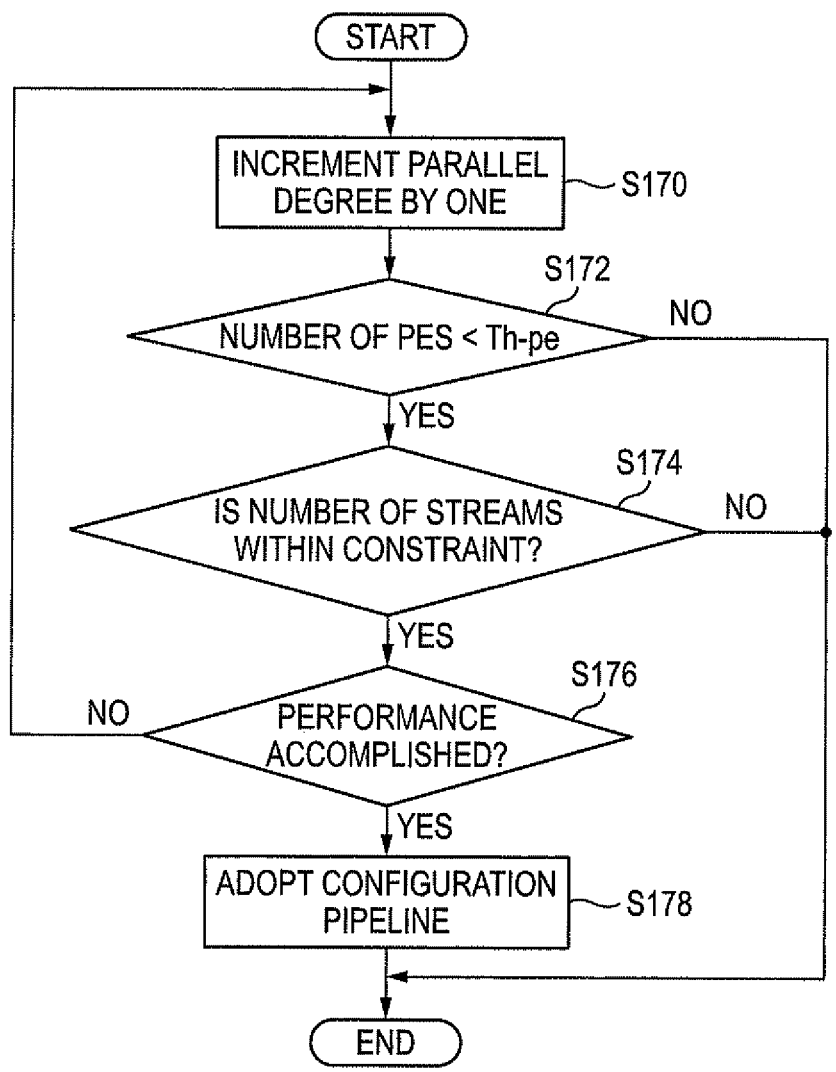
FIG. 14 is a flowchart to show a procedure example of parallelization of configurations of one system.

FIGS. 13 and 14 show an example of the parallelization evaluation processing. In this processing, first as shown in FIG. 13, the configuration pipeline of the first system is parallelized (S150) and whether or not objective performance (for example, objective processing time) can be accomplished by parallelization (S152).

In more detail, as shown in FIG. 14, first the parallel degree of a previously specified configuration (or a specific element circuit in the configuration) of the configuration pipeline is incremented by one (S170). That is, the number of configurations or element circuits is incremented by one and wiring is performed so that parallel processing can be performed. The configuration pipeline creation apparatus in FIG. 8 may create previously specified configurations or element circuits parallelized in various parallel degrees, of the configuration pipeline for one implementation system. At S170, those whose parallel degree is incremented by one may be selected from among them.

The implementation system determination processing 322 determines whether or not the number of PEs used in the configurations whose parallel degree is incremented is within upper limit TH-pe of the number of PEs that can be assigned to the implementation target processing (S172). If the number of PEs is within the upper limit TH-pe of the number of PEs, further the number of streams used by the configurations is within the constraint range as at S120 (S174). If the number of streams is within the constraint range, the configuration pipeline whose parallel degree is further incremented can accomplish the objective performance as at S118 (S176). If it is determined at S176 that the objective performance can be accomplished, the configuration pipeline of the parallel degree is adopted (S178). In this case, for example, the determination result at S152 in FIG. 13 becomes Yes and the parallelization processing terminates.

If the performance cannot be accomplished, the process returns to S170 and the parallel degree is incremented and similar determination is repeated. If the number of PEs or the number of streams exceeds the upper limit at S172 or S174, the configurations cannot be configured within the given constraint and if the parallel degree is further incremented, the number of PEs or the number of streams increases more and more and thus the processing is aborted. In this case, for example, the determination result at S152 in FIG. 13 becomes No and parallelization and performance determination (S154 and S156) are performed in a similar manner about the third system. If it is determined that the objective performance is accomplished in the parallelization and moreover implementation is also possible in the number of PEs and the number of streams, the configuration pipeline of the parallelization result of the third system is adopted.

If the objective performance cannot be accomplished within the constraints of the number of PEs and the number of streams, parallelization and performance determination (S158 and S160) are performed in a similar manner about the second system. If it is determined that the objective performance is accomplished in the parallelization and moreover implementation is also possible in the number of PEs and the number of streams, the configuration pipeline of the parallelization result of the second system is adopted.

If the objective performance cannot be accomplished within the constraint in parallelization of the second system, the configuration pipeline of the highest performance (namely, the shortest estimated processing time) of the parallelization results satisfying the constraints of the number of PEs and the number of streams of the first system, the third system, and the second system is adopted and the processing is terminated.

The reconfiguration control processing 326 controls reconfiguration of the DRP 34 in accordance with the data of the configuration pipeline thus adopted.

As described above, in the procedure in FIGS. 11 and 12, determination is made in the ascending order of the circuit scale (namely, simultaneously occupation area of the reconfigurable logical circuit 342) and if the objective performance can be accomplished, the configuration pipeline of the system is adopted. Therefore, the configuration pipeline of the smallest circuit scale among the configuration pipelines that can accomplish the objective performance can be adopted.

The system in which the configuration pipeline of the smallest circuit scale among the configuration pipelines that can accomplish the objective performance can be preferentially adopted is only an example. For example, instead, a procedure of adopting the configuration pipeline of the highest estimated performance (estimated processing time, etc.,) of the configuration pipelines satisfying the constraints of the circuit scale (the number of PEs and the number of streams) maybe used. A procedure of giving a score to the configuration pipeline of each implementation system from the viewpoint of the circuit scale and the viewpoint of the estimated performance and totally evaluating the scores of both, and adopting the configuration pipeline of the highest score is also possible.

Figure 11:
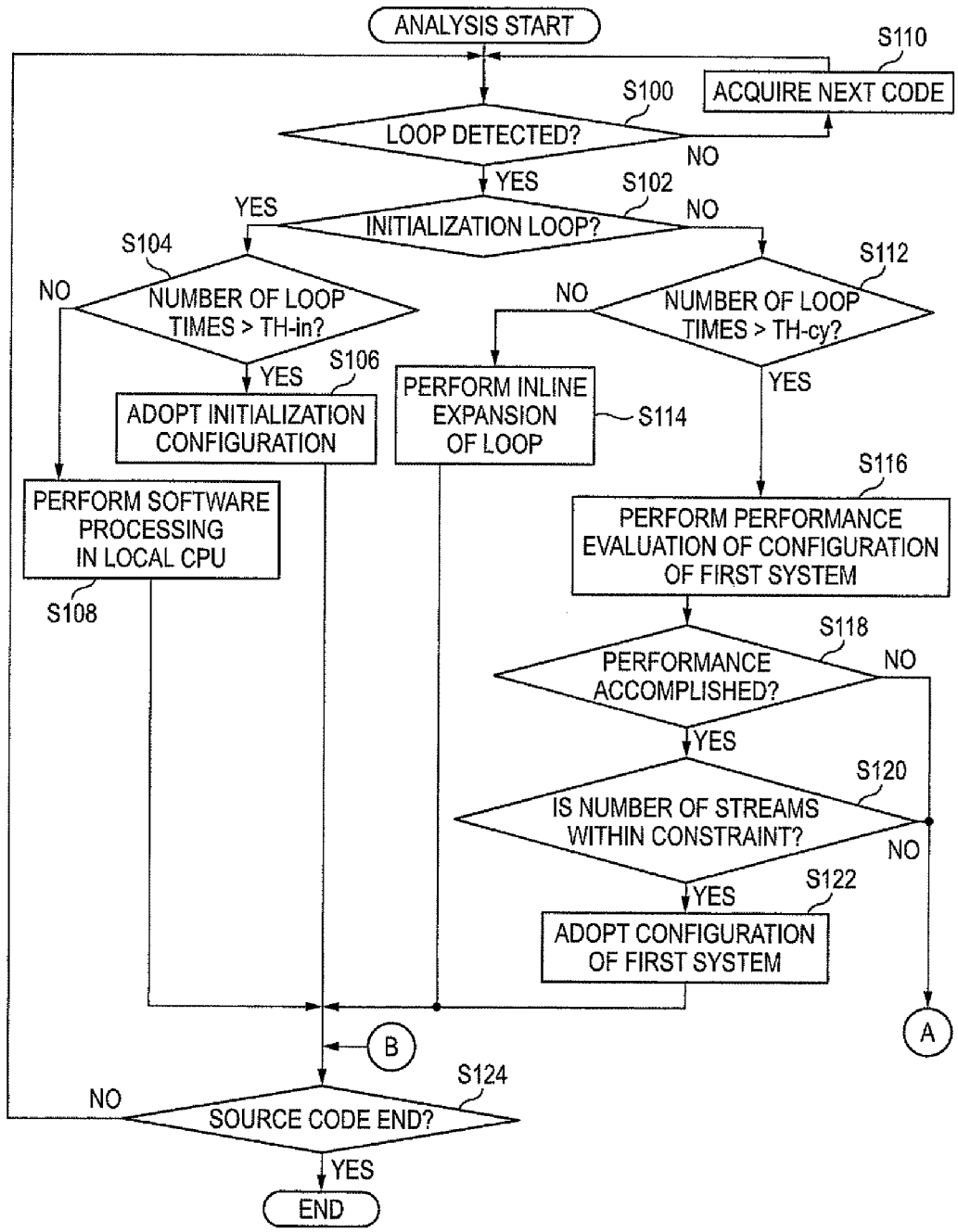
FIG. 11 is a flowchart to show a part of a processing procedure example of implementation system determination processing.

In the procedure in FIGS. 11 and 12, to determine the implementation system, the source code of the implementation target processing is analyzed; this is only an example. As illustrated in FIG. 8, the source code is previously analyzed and the data of the configuration pipeline of each implementation system is created. Thus, when the data is created, the latency of each of the configurations making up the configuration pipeline may be calculated and stored, and the implementation system determination processing 322 may use the amount of the data to be processed simply set as a parameter and the stored latency of each of the configurations of the configuration pipeline to find the number of cycles without determining whether or not a loop exists, and may find the estimated processing time based on the number of cycles, thereby determining whether or not the performance of the configuration pipeline is sufficient.

Next, the case where the DRP incorporating system 30 is caused to execute large processing wherein a plurality of merges of asynchronous processing results as described above exist will be discussed. Each merge processing contained in the large processing (namely, combination of a plurality of types of preprocessing in asynchronous relationship and post processing of merge destination) can be recognized as one implementation target processing as illustrated in FIG. 1. The large processing may be recognized as a plurality of types of implementation target processing form a pipeline. Here, in one example, the objective processing time may be set for each of a plurality of types of implementation target processing making up the large processing and previously the implementation system that can accomplish the objective processing time may be determined according to the method described above.

As another example, the data processing time when each implementation target processing is actually reconfigured and is caused to perform data processing may be measured and the measurement value may be reflected on selection of the implementation system of the next implementation target processing. Such an example is shown in FIG. 15.

Figure 15:
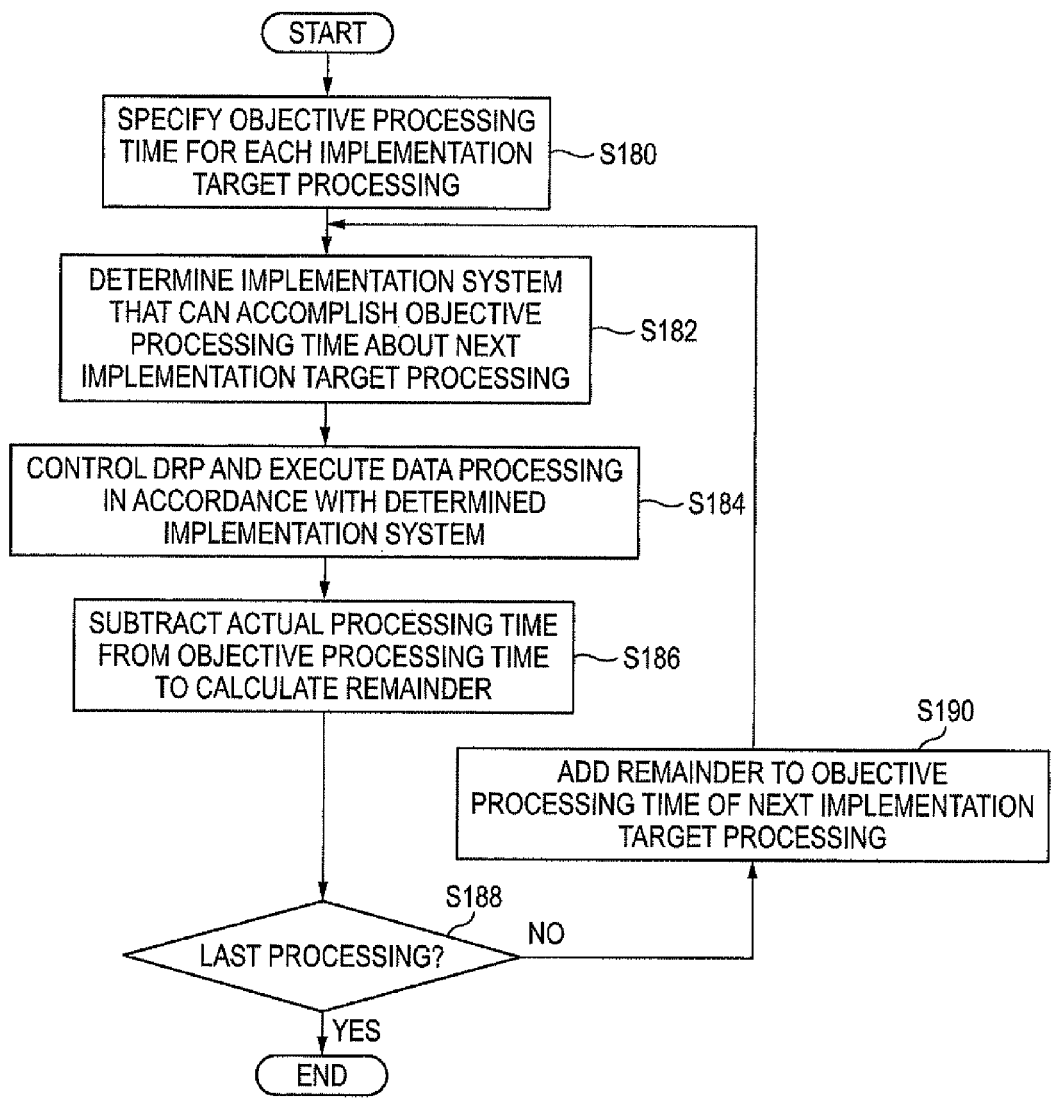
FIG. 15 is a flowchart to show a processing example when a plurality of types of implementation target processing are executed in order.

In the procedure shown in FIG. 15, the user presets the objective processing time for each implementation target processing (S180). If a processing start command is given, the implementation system determination processing 322 determines the implementation system of the top implementation target processing in accordance with the procedure as shown in FIGS. 11 to 14 (S182). In this determination, the implementation system satisfying the objective processing time set at S180 is selected. Next, the reconfiguration control processing 326 controls the DRP 34 and causes the DRP 34 to perform processing in accordance with the configuration pipeline of the determined implementation system (S184). When the data processing is executed, the time taken for processing the data as much as a processing unit (for example, one band, one page, etc.,) by the configuration pipeline is measured. The measurement value is subtracted from the objective processing time used in the determination at S182, thereby calculating the remainder (margin) time viewed from the objective processing time (S186). In the determination at S182, the implementation system is determined with a measure of margin relative to the objective processing time and thus it may be considered that the subtraction result at S186 does not become a negative value. If the implementation target processing is not last processing in the large processing (S188), the remainder time is added to the objective processing time of the next implementation target processing (S190). The process returns to S182 and the implementation system about the next implementation target processing is determined based on the objective processing time to which the remainder time is added. The processing is repeated until the last implementation target processing is reached. When the time required for the data processing is far longer than the required time of the implementation system determination processing 322, if such control is performed, a time loss scarcely exists.

According to the control, if a time margin occurs in the actual data processing, the first system with the smaller circuit scale about the next implementation target processing can be made to easily be selected.

The foregoing description of the exemplary embodiments of the present invention has been provided for the purposes of illustration and description. It is not intended to be exhaustive or to limit the invention to the precise forms disclosed. Obviously, many modifications and variations will be apparent to practitioners skilled in the art. The embodiments were chosen and described in order to best explain the principles of the invention and its practical applications, thereby enabling others skilled in the art to understand the invention for various embodiments and with the various modifications as are suited to the particular use contemplated. It is intended that the scope of the invention be defined by the following claims and their equivalents.

What is claimed is:

1. A data processing apparatus comprising:
an extraction section that extracts a plurality of types of preprocessing in asynchronous relationship with each other and post processing for inputting a processing result of each preprocessing from implementation target processing;
an implementation section that has as implementation systems for implementing the implementation target processing using a reconfigurable circuit, a plurality of implementation systems including
(1) a first implementation system for (i) reconfiguring prestage circuits each for each of the plurality of types of preprocessing in order on the reconfigurable circuit, (ii) causing each reconfigured prestage circuit to execute corresponding preprocessing, (iii) storing a processing result of each prestage circuit in a memory, (iv) after completion of the processing of each prestage circuit, reconfiguring a poststage circuit for executing postprocessing on the reconfigurable circuit, (v) inputting the processing result of each prestage circuit stored in the memory into the reconfigured poststage circuit, and causing the poststage circuit to execute processing and
(2) a second implementation system for reconfiguring each prestage circuit, the poststage circuit, and a synchronizing circuit for synchronizing when the processing result of each prestage circuit is input to the poststage circuit on the reconfigurable circuit at the same time, and operating them,
the implementation section that implements the implementation target processing using the reconfigurable circuit in a selected one of the implementation systems; and
a control section that determines which implementation system of the first implementation system and the second implementation system is to be adopted based on an estimation value of time required for processing data of a specified data amount when each of the implementation systems is adopted and a circuit scale of each prestage circuit, the poststage circuit, and the synchronizing circuit reconfigured at the same time on the reconfigurable circuit in each of the implementation systems,
the control section commanding the implementation section to implement the determined implementation system.

2. The data processing apparatus according to claim 1, wherein a rank of the circuit scales of the circuits reconfigured at the same time on the reconfigurable circuit is stipulated in the plurality of implementation systems, and wherein the control section determines to adopt the implementation system with the smallest circuit scale of the circuits reconfigured at the same time on the reconfigurable circuit among the implementation systems that can process the data of the specified amount within a specified objective processing time.

3. The data processing apparatus according to claim 2, wherein when the reconfigurable circuit is caused to execute a plurality of types of implementation target processing in order,
the control section implements a first one of the plurality of types of implementation target processing using the reconfigurable circuit in the implementation system determined about a second one of the plurality of types of implementation target processing, causes the reconfigurable circuit to actually process the data of the specified data amount, measures a time actually required for the processing, subtracts the time actually required for the processing from the objective processing time to find a remainder time, adds the remainder time, thereby correcting the objective processing time of the next implementation target processing of the first one of the plurality of types of implementation target processing, and determines the implementation system based on the corrected objective processing time about a next one of the plurality of types of implementation target processing.

* * * * *